United States Patent
Satou et al.

(10) Patent No.: US 8,592,317 B2
(45) Date of Patent: Nov. 26, 2013

(54) POLISHING SOLUTION FOR CMP AND POLISHING METHOD USING THE POLISHING SOLUTION

(75) Inventors: Eiichi Satou, Hitachi (JP); Shigeru Nobe, Hitachi (JP); Munehiro Oota, Hitachi (JP); Masayuki Hanano, Hitachi (JP); Shigeru Yoshikawa, Hitachi (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 177 days.

(21) Appl. No.: 13/102,486

(22) Filed: May 6, 2011

(65) Prior Publication Data

US 2011/0275217 A1 Nov. 10, 2011

(30) Foreign Application Priority Data

May 7, 2010 (JP) ................. P2010-107529

(51) Int. Cl.
  *H01L 21/306* (2006.01)
  *H01L 21/304* (2006.01)
  *C09K 13/00* (2006.01)

(52) U.S. Cl.
  USPC ............ 438/693; 252/79.1; 257/E21.23

(58) Field of Classification Search
  None
  See application file for complete search history.

(56) References Cited

U.S. PATENT DOCUMENTS

| | | | |
|---|---|---|---|
| 7,071,105 B2 * | 7/2006 | Carter et al. | 438/690 |
| 7,442,645 B2 * | 10/2008 | Carter et al. | 438/690 |
| 8,247,327 B2 * | 8/2012 | De Rege Thesauro et al. | 438/693 |
| 8,277,681 B2 * | 10/2012 | Inada et al. | 252/79.4 |
| 2004/0152309 A1 * | 8/2004 | Carter et al. | 438/689 |
| 2005/0067378 A1 * | 3/2005 | Fuerhaupter et al. | 216/34 |
| 2005/0148290 A1 | 7/2005 | De Rege Thesauro et al. | |
| 2006/0000808 A1 * | 1/2006 | Seki et al. | 216/88 |
| 2006/0144824 A1 * | 7/2006 | Carter et al. | 216/89 |
| 2006/0196848 A1 * | 9/2006 | Carter et al. | 216/88 |
| 2007/0293048 A1 * | 12/2007 | Lee et al. | 438/692 |
| 2008/0064211 A1 * | 3/2008 | Tsugita et al. | 438/691 |
| 2008/0067679 A1 * | 3/2008 | Takagi et al. | 257/751 |
| 2008/0271383 A1 * | 11/2008 | Yoshida et al. | 51/298 |
| 2009/0029633 A1 * | 1/2009 | Carter et al. | 451/41 |
| 2009/0094901 A1 * | 4/2009 | Shinoda et al. | 51/306 |

(Continued)

FOREIGN PATENT DOCUMENTS

| | | |
|---|---|---|
| EP | 1 043 379 A1 | 10/2000 |
| EP | 1 369 906 A1 | 12/2003 |

(Continued)

OTHER PUBLICATIONS

Notification of Transmittal of Translation of the International Preliminary Report on Patentability (Form PCT/IB/338) of International Application No. PCT/JP2009/070692 mailed Jul. 14, 2011 with Forms PCT/IB/373 and PCT/ISA/237.

(Continued)

*Primary Examiner* — Allan Olsen

(74) *Attorney, Agent, or Firm* — Westerman, Hattori, Daniels & Adrian, LLP

(57) ABSTRACT

The polishing solution for CMP of the invention comprises abrasive grains, a first additive and water, wherein the first additive is at least 1,2-benzoisothiazole-3(2H)-one or 2-aminothiazole. The polishing method of the invention is a polishing method for a substrate having a silicon oxide film on the surface, and the polishing method comprises a step of polishing the silicon oxide film with a polishing pad while supplying the polishing solution for CMP between the silicon oxide film and the polishing pad.

19 Claims, 1 Drawing Sheet

(56) References Cited

U.S. PATENT DOCUMENTS

| | | | |
|---|---|---|---|
| 2009/0203215 A1* | 8/2009 | Yoshikawa et al. | 438/693 |
| 2009/0209104 A1* | 8/2009 | Kimura | 438/693 |
| 2009/0221145 A1* | 9/2009 | Inada et al. | 438/693 |
| 2010/0029181 A1* | 2/2010 | De Rege Thesauro et al. | 451/37 |
| 2010/0075498 A1* | 3/2010 | Takagi et al. | 438/678 |
| 2010/0075500 A1* | 3/2010 | Yoshikawa et al. | 438/692 |
| 2010/0120250 A1* | 5/2010 | Amanokura et al. | 438/693 |
| 2010/0248486 A1* | 9/2010 | Nakamura | 438/706 |
| 2010/0323584 A1* | 12/2010 | Haga et al. | 451/36 |
| 2011/0104992 A1* | 5/2011 | Haga et al. | 451/36 |
| 2011/0275217 A1* | 11/2011 | Satou et al. | 438/693 |
| 2011/0275285 A1* | 11/2011 | Satou et al. | 451/37 |
| 2012/0280170 A1* | 11/2012 | De Rege Thesauro et al. | 252/79.1 |

FOREIGN PATENT DOCUMENTS

| | | |
|---|---|---|
| JP | 3256665 A | 11/1991 |
| JP | 07-216345 A2 | 8/1995 |
| JP | 08-339980 A2 | 12/1996 |
| JP | 09-137155 A2 | 5/1997 |
| JP | 2005-347579 A2 | 12/2005 |
| JP | 2006-523385 A | 10/2006 |
| JP | 2007-053213 A2 | 3/2007 |
| JP | 2007-520062 A | 7/2007 |
| JP | 2008-529280 A | 7/2008 |
| JP | 2008-536302 A | 9/2008 |
| JP | 2008-288537 A2 | 11/2008 |
| JP | 2009-231795 A2 | 10/2009 |
| WO | 99/31195 A1 | 6/1999 |
| WO | 02/067309 A1 | 8/2002 |
| WO | 2006/105020 A1 | 10/2006 |

OTHER PUBLICATIONS

Torajiro et al., "Effect of Various Factors on Grinding Using Jet Mill", Dept. of Chem. English Yamagata Univ., Yonezawa 922, pp. 527-532 (with English abstract).

Korean Notice of Allowance dated Feb. 22, 2013, issued in corresponding Korean Patent Application No. 10-2011-7010783.

Chinese Office Action dated Mar. 5, 2013, issued in corresponding Chinese Patent Application No. 200980148395.7.

Japanese Office Action dated Jan. 15, 2013, issued in related Japanese Patent Application No. 2010-542124, (2 pages).

* cited by examiner (a)
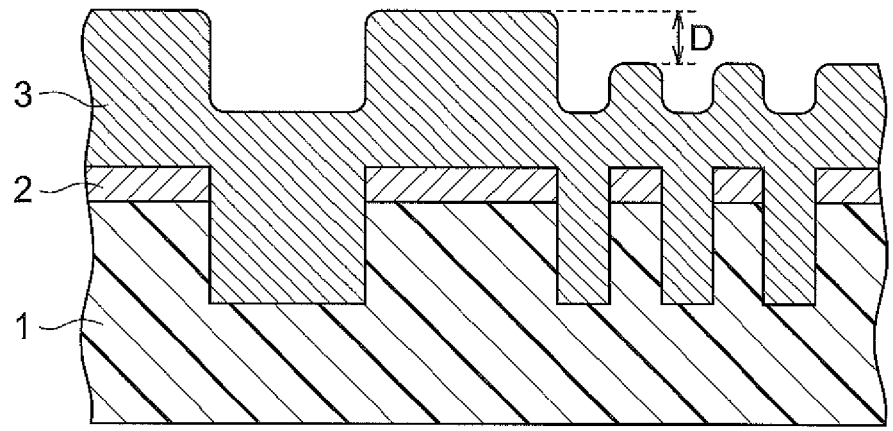
(b)
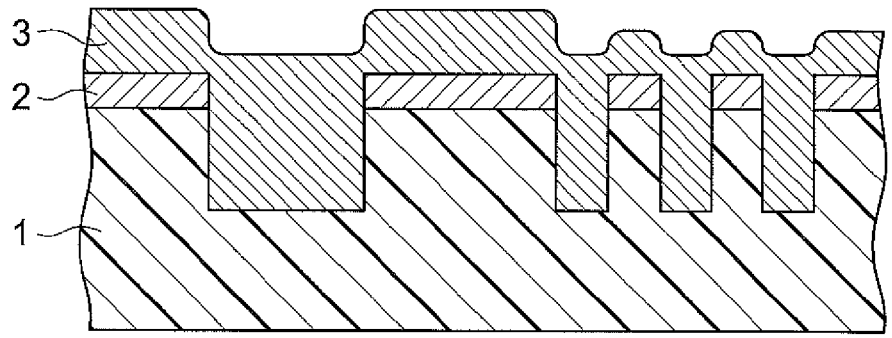
(c)
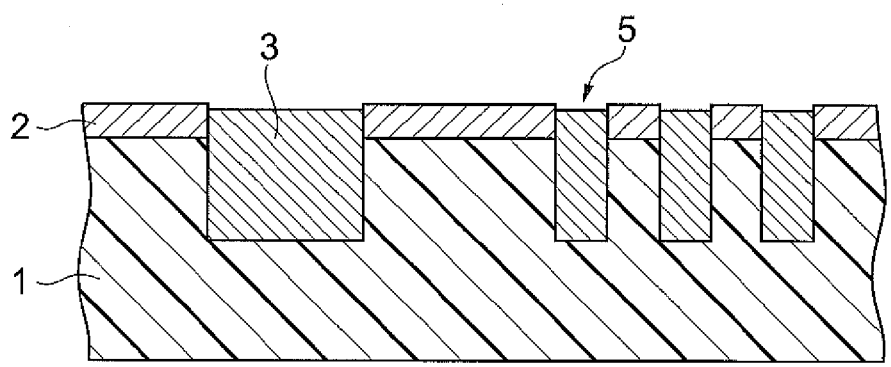

POLISHING SOLUTION FOR CMP AND POLISHING METHOD USING THE POLISHING SOLUTION

BACKGROUND OF THE INVENTION

1. Field of the Invention

The present invention relates to a polishing solution to be used for chemical mechanical polishing (CMP) of semiconductor wafer materials, and to a polishing method using the polishing solution. In particular, the invention relates to a polishing solution for polishing of a silicon oxide film formed on the surface of a semiconductor wafer, and to a polishing method using the polishing solution.

2. Related Background Art

With the increasingly high performance of super-LSI devices in the field of semiconductor manufacturing, limits are rapidly being reached in terms of both high integration and high speed in techniques of micronization on extension of the prior art. This situation has spurred development of techniques for high integration in the vertical direction as well, i.e. multilayering of wirings, as micronization of semiconductor elements continues to advance.

CMP technique is one of the most important techniques used in processes for production of devices with multilayered wiring. CMP technique is a technique in which a thin-film is formed on a substrate by chemical vapor deposition (CVD) or the like, and then the surface is flattened. For example, CMP treatment is indispensable for ensuring focal depth for lithography. When convexo-concave is present on a substrate surface, inconveniences arise as focusing becomes impossible in the exposure step or fine wiring structures cannot be sufficiently formed. CMP technique is also applied in device manufacturing steps, such as steps of forming device isolation regions by polishing of plasma oxide films (BPSG, HDP-$SiO_2$, p-TEOS), steps of forming interlayer insulating films, or steps of flattening plugs (such as Al or Cu plugs) after embedding silicon oxide-containing films in metal wirings.

CMP is usually carried out using an apparatus that can supply a polishing solution onto a polishing pad. A substrate surface is polished by pressing the substrate against the polishing pad while supplying the polishing solution between the substrate surface and polishing pad. High performance polishing solutions is one of the essential technology for CMP technology, and various polishing solutions have been developed to date (see Japanese Unexamined Patent Application Publication No. 2008-288537, for example).

SUMMARY OF THE INVENTION

In a step of forming a device isolation region on a substrate, a groove is first formed in the substrate surface and an insulating film (for example, a silicon oxide film) is formed by CVD or the like to fill the groove. The surface of the insulating film is then flattened by CMP to form the device isolation region. When an insulating film is formed on a substrate of which a device isolation structure such as a groove has been formed on the surface, convexo-concave is are produced in the surface of the insulating film as well, corresponding to the convexo-concave of the device isolation structure. The surface with convexo-concave is flattened by preferentially removing the convex portion while slowly removing the concave portion.

For improved throughput of semiconductor production, it is preferred to remove the undesired sections of the insulating film formed on the substrate, as rapidly as possible. For example, when employing shallow trench isolation (STI) for narrowing of a device isolation region, the undesired portions of the silicon oxide film formed on the substrate as an insulating film must be removed with a high polishing speed.

However, polishing solutions for CMP with high polishing speeds for silicon oxide films generally tend to result in inferior flatness of polished surfaces upon completion of polishing. Polishing of insulating films is therefore sometimes divided into two stages, using different polishing solutions for each stage, to improve production efficiency. In the first step (rough polishing step), a polishing solution with a high polishing speed for silicon oxide films is used for removal of major portion of the silicon oxide film. In the second step (finishing step), the silicon oxide film is slowly removed by finishing to a sufficiently flat polishing surface.

A high polishing speed for the silicon oxide film is essential in the first step, as mentioned above. However, it is not possible to achieve a sufficiently high polishing speed in some cases, depending on the condition of the substrate surface, even using the same polishing solution. For example, when polishing a wafer comprising a flat substrate and a flat silicon oxide film formed on its surface (silicon oxide film blanket wafer), a high polishing speed for the silicon oxide film can be achieved, but the expected polishing speed cannot be attained for some cases of polishing if the wafer has convexo-concave on the surface. Incidentally, the mechanism by which a silicon oxide film is polished by CMP is still yet to be understood completely, and the cause of this phenomenon is as yet unknown.

Convexo-concave formed on substrate surfaces takes a variety of forms. For example, the widths of convexo-concave, which are dependent on the wiring width, and the convex portion of convexo-concave and the wiring directions differ according to each step and depending on the purpose of the device. Current conventional polishing solutions for CMP, even when they allow satisfactory polishing of certain substrates, are not always able to accomplish comparable polishing of other types of substrates. Particularly when CMP of a silicon oxide film is divided into two or more stages, as mentioned above, a high polishing speed takes precedence over flatness in the first step, and therefore a lower polishing speed results in lower productivity.

It is an object of the present invention to solve this problem, by providing a polishing solution for CMP with high flexibility of use, that can achieve a sufficiently high polishing speed for silicon oxide films while being less dependent on the substrate surface condition compared to conventional polishing solutions, as well as a polishing method using the polishing solution.

The present inventors have conducted much diligent research on additives included in polishing solutions for CMP, with the aim of solving the problem described above. The present inventors used different organic compounds as additives for preparation of a variety of polishing solutions. These polishing solutions were used for polishing of silicon oxide films, and the polishing speeds were evaluated. As a result, it was found that using a specific compound as an additive is effective for achieving a sufficiently high polishing speed, and the present invention has been completed upon this finding.

Specifically, the invention provides a polishing solution for CMP comprising abrasive grains, a first additive and water, wherein the first additive is at least 1,2-benzoisothiazole-3 (2H)-one or 2-aminothiazole.

The polishing solution for CMP of the invention allows a sufficiently high polishing speed to be achieved for silicon oxide films. Moreover, such a high polishing speed can be achieved without significant dependence on the condition of the substrate surface to be polished. While the factors involved in this exhibited effect are not fully understood, it is conjectured that the use of the specific compound as the first additive increases interaction between the polishing solution and the silicon oxide film, resulting in a higher polishing speed.

Thus, since the polishing solution for CMP of the invention allows a high polishing speed to be achieved without significant dependence on the condition of the substrate surface, it is suitable for rough polishing of silicon oxide films formed on substrates with convexo-concave. The polishing solution for CMP of the invention is also advantageous in that it allows high-speed polishing even using semiconductor substrates with which high polishing speeds cannot be easily achieved by conventional polishing solutions. For example, a high polishing speed can be achieved for polishing of silicon oxide films on substrates having sections with concave portion or convex portion formed in a T-shaped or lattice-shaped fashion when viewed from above, as in the case of semiconductor boards comprising memory cells.

As a result of much diligent research, the present inventors have found that using a compound having a specific chemical structure as a second additive together with the first additive is effective for achieving an even higher polishing speed.

That is, the polishing solution for CMP of the invention preferably further comprises a second additive satisfying the following conditions i) to v).

i) Having in the molecule at least cyclic structure including at least one carbon-carbon double bond, the "carbon-carbon double bond" optionally including carbon-carbon bonds forming a resonance structure;

ii) Having at least one and not more than four —OH structures in the molecule, the —OH structures optionally including the —OH structures in —COOH groups;

iii) Having not more than one —COOH group in the molecule;

iv) Having either or both the following first structure and/or second structure in the molecule;

First structure: A structure comprising a carbon atom $C^1$ and a carbon atom $C^2$ adjacent to the carbon atom $C^1$, an —OH group being bonded to the carbon atom $C^1$, and at least one substituent selected from the group consisting of —OX, =O, —NX, —NX($C^3$) and —CH=N—OH groups being bonded to the carbon atom $C^2$, where X represents hydrogen atom or a carbon atom and $C^3$ represents a carbon atom bonded to the nitrogen atom N in the —NX($C^3$) group, wherein the bonding forms and bonding atoms of the remaining unshown bonds of the carbon atoms $C^1$, $C^2$ and $C^3$ are optional, and when X is a carbon atom, the bonding forms and bonding atoms of the remaining unshown bonds of X are optional;

Second structure: A structure comprising a carbon atom $C^1$ and a carbon atom $C^2$ adjacent to the carbon atom $C^1$, a —CH=N—OH group being bonded to the carbon atom $C^1$ and a —CH=N—OH group being bonded to the carbon atom $C^2$, wherein the bonding forms and bonding atoms of the remaining unshown bonds of the carbon atoms $C^1$ and $C^2$ are optional;

v) Either or both the carbon atom $C^1$ and/or carbon atom $C^2$ according to condition iv) forms part of the cyclic structure according to condition i), or is bonded to the cyclic structure according to condition i).

By adding the second additive, the polishing solution for CMP of the invention allows an even higher polishing speed to be achieved for silicon oxide films. Moreover, such a high polishing speed can be achieved without significant dependence on the condition of the substrate surface to be polished.

While the factors involved in this exhibited effect are not fully understood, it is conjectured that the use of the second additive with a specific chemical structure increases interaction between the polishing solution and the silicon oxide film, resulting in an even higher polishing speed. The polishing solution for CMP of the invention is also advantageous in that it allows polishing at an even higher speed even when using semiconductor substrates with which high polishing speeds cannot be easily achieved by conventional polishing solutions.

The first structure according to condition iv) is preferably selected from among structures represented by the following formulas a) to m).

[Chemical Formula 1]

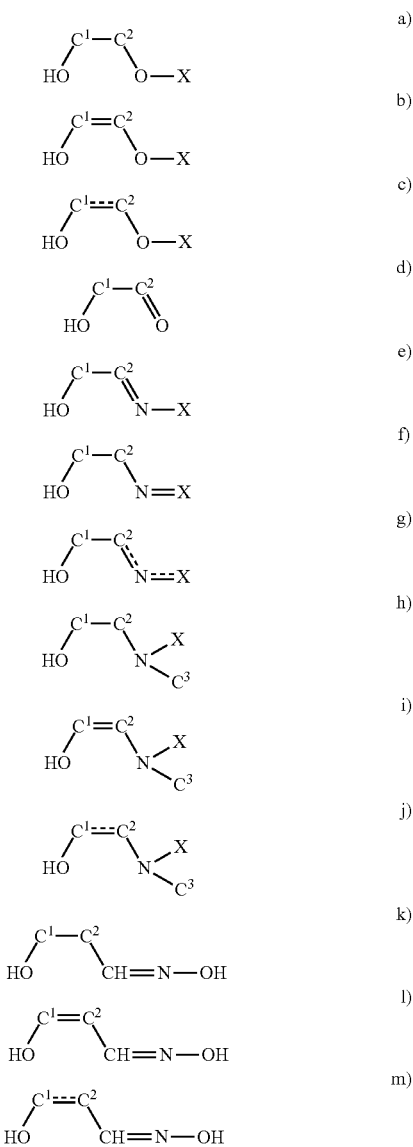

[In the formulas, the bond represented by a pair of solid line and dotted line indicates a bond forming a resonance structure, the bonding forms and bonding atoms of the remaining unshown bonds of the carbon atoms $C^1$, $C^2$ and $C^3$ are optional, and when X is a carbon atom, the bonding forms and bonding atoms of the remaining unshown bonds of X are optional.]

By adding the compound with a structure represented by any of formulas a) to m) to the polishing solution, it is possible to achieve even higher polishing speeds for silicon oxide films. Presumably this is because, with addition of the aforementioned compound to the polishing solution, interaction between the polishing solution and silicon oxide film is further increased.

The second structure according to condition iv) is preferably selected from among structures represented by the following formulas n) to p).

[Chemical Formula 2]

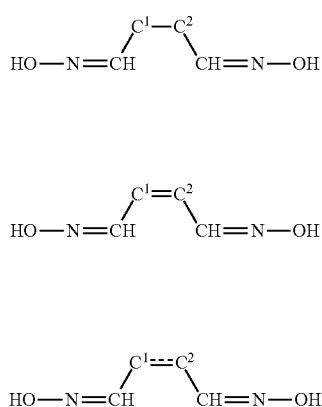

[In the formulas, the bond represented by a pair of solid line and dotted line indicates a bond forming a resonance structure, and the bonding forms and bonding atoms of the remaining unshown bonds of the carbon atoms $C^1$ and $C^2$ are optional.]

By adding the compound with a structure represented by any of formulas n) to p) to the polishing solution, it is possible to achieve even higher polishing speeds for silicon oxide films. Presumably this is because, with addition of the aforementioned compound to the polishing solution, interaction between the polishing solution and silicon oxide film is further increased.

From the viewpoint of achieving an even higher polishing speed for silicon oxide films, the second additive is preferably at least one type of compound selected from the group consisting of uracil-6-carboxylic acid, mandelic acid, salicylaldoxime, ascorbic acid, catechol, 3-methylcatechol, 4-methylcatechol, 4-tert-butylcatechol, 1,4-benzoquinonedioxime, 2-pyridinemethanol, 4-isopropyltropolone, 2-hydroxy-2,4,6-cycloheptatrien-1-one, 5-amino-uracil-6-carboxylic acid and benzilic acid.

The present inventors further conducted periodic measurement of particle sizes to determine the presence or absence of aggregation of abrasive grains in different prepared polishing solutions for CMP. As a result it was found that when, among the second additives having the specific chemical structures mentioned above, a 4-pyrone-based compound having a specific structure is included in the polishing solution for CMP, an effect is exhibited which allows aggregation of abrasive grains to be inhibited, in addition to the effects described above. That is, from the viewpoint of dispersion stability of the abrasive grains, the second additive is preferably a 4-pyrone-based compound represented by the following formula (1).

[Chemical Formula 3]

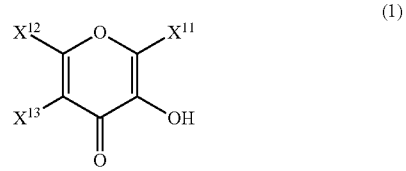

[In the formula, $X^{11}$, $X^{12}$ and $X^{13}$ each independently represent hydrogen atom or a monovalent substituent.]

A polishing solution for CMP comprising a compound represented by formula (1) allows a higher polishing speed to be achieved for silicon oxide films, while also inhibiting aggregation of abrasive grains. While the factors involved in this exhibited effect are not fully understood, it is conjectured that the use of the 4-pyrone-based compound having a specific structure as an additive further increases interaction between the polishing solution for CMP and the silicon oxide film, resulting in an even higher polishing speed. In addition, it would appear that despite the fact that the 4-pyrone-based compound is an additive that can increase interaction between the polishing solution for CMP and the silicon oxide film, it has little effect of weakening repulsion such as electrostatic repulsion between the abrasive grains, and can therefore inhibit aggregation of the abrasive grains.

The 4-pyrone-based compound is preferably at least one type of compound selected from the group consisting of 5-hydroxy-2-(hydroxymethyl)-4H-pyran-4-one, 3-hydroxy-2-methyl-4H-pyran-4-one and 3-hydroxy-2-ethyl-4H-pyran-4-one. This will allow an even higher polishing speed to be achieved for silicon oxide films, while also inhibiting aggregation of abrasive grains.

The total of the first additive content and the second additive content is preferably 0.01-5.0 parts by mass with respect to 100 parts by mass of the polishing solution for CMP. Employing such a construction will allow the polishing speed-improving effect to be efficiently obtained.

The polishing solution for CMP of the invention preferably further comprise a saturated monocarboxylic acid. The number of carbon atoms of the saturated monocarboxylic acid is preferably 2-6. The saturated monocarboxylic acid is preferably at least one type of compound selected from the group consisting of acetic acid, propionic acid, butyric acid, isobutyric acid, valeric acid, isovaleric acid, pivalic acid, hydroangelic acid, caproic acid, 2-methylpentanoic acid, 4-methylpentanoic acid, 2,3-dimethylbutanoic acid, 2-ethylbutanoic acid, 2,2-dimethylbutanoic acid and 3,3-dimethylbutanoic acid.

The pH of the polishing solution for CMP of the invention is preferably not higher than 8.0. With the pH of not higher than 8.0, an effect of improved wettability between the polishing solution and the silicon oxide film will be exhibited. The polishing solution for CMP of the invention may further comprise a pH regulator.

The first additive content is preferably 0.01-5.0 parts by mass with respect to 100 parts by mass of the polishing solution for CMP. Employing such a construction will allow the polishing speed-improving effect to be efficiently obtained.

The abrasive grain content is preferably 0.01-10 parts by mass with respect to 100 parts by mass of the polishing solution for CMP. The mean particle size of the abrasive grains is preferably 50-500 nm. The abrasive grains preferably comprise a cerium-based compound, the cerium-based compound is more preferably cerium oxide. The abrasive grains preferably comprise polycrystalline cerium oxide having grain boundaries. Employing one or more from among these constructions for the abrasive grains will still further increase the polishing speed for silicon oxide films.

The polishing solution for CMP of the invention may further comprise a nonionic surfactant. Employing such a construction will improve the dispersion stability of the abrasive grains in the polishing solution.

The invention also provides a polishing method using the polishing solution for CMP described above. Specifically, the polishing method of the invention is a polishing method for a substrate having a silicon oxide film on the surface, and the polishing method comprises a step of polishing the silicon oxide film with a polishing pad while supplying the polishing solution for CMP described above between the silicon oxide film and the polishing pad. This polishing method allows a sufficiently high polishing speed to be achieved for silicon oxide films. Since a high polishing speed is thus achieved without significant dependence on the surface form of the substrate being polished, the polishing method is suitable for rough polishing of silicon oxide films or for polishing of semiconductor boards with memory cells.

According to the invention there is provided a polishing solution for CMP with high flexibility of use, that can achieve a sufficiently high polishing speed for silicon oxide films while being less dependent on the substrate surface condition compared to conventional polishing solutions. According to the invention there is also provided a polishing method using the polishing solution.

BRIEF DESCRIPTION OF THE DRAWINGS

FIGS. 1(a)-1(c) are schematic cross-sectional views illustrating a procedure in which a silicon oxide film is polished and a shallow trench isolation structure is formed on a semiconductor board.

DESCRIPTION OF THE PREFERRED EMBODIMENTS

<Polishing Solution for CMP>

The polishing solution for CMP of this embodiment comprises at least abrasive grains (abrasive particles), a first additive (hereunder referred to as "additive A") and water, and optionally comprises a compound having a specific chemical structure as a second additive (hereunder referred to as "additive B"). The polishing solution for CMP of this embodiment also optionally comprises a compound having a specific chemical structure as a third additive (hereunder referred to as "additive C"). The polishing solution for CMP of this embodiment may comprise both the additive B and additive C, and may comprise either the additive B or additive C. Each component used for preparation of the polishing solution for CMP will now be explained.

(Additives)

[Additive A]

The polishing solution for CMP of this embodiment comprises at least 1,2-benzoisothiazole-3(2H)-one or 2-aminothiazole as additive A. By using such a compound as additive A in the polishing solution for CMP of this embodiment, it is possible to achieve a sufficiently high polishing speed for silicon oxide films, with less dependence on the substrate surface compared to using a conventional polishing solution.

[Additive B]

The polishing solution for CMP of this embodiment preferably comprises at least one type of compound satisfying all of the following conditions i) to v) as additive B. By using a compound satisfying conditions i) to v) as additive B together with additive A in the polishing solution for CMP of this embodiment, it is possible to achieve an even higher polishing speed for silicon oxide films, with less dependence on the substrate surface compared to using a conventional polishing solution.

Condition i) is that of having in the molecule at least one cyclic structure including at least one carbon-carbon double bond. Here, "carbon-carbon double bond" may include a carbon-carbon bond that forms a resonance structure, and the term normally encompasses not only ordinary double bonds but also carbon-carbon bonds that form a resonance structure. That is, compounds having a resonance structure with delocalized electrons in the molecule, represented by C=C as the chemical formula, are also compounds satisfying condition i). Specific examples thereof include compounds with benzene rings or pyridine rings. There are no particular restrictions on the type of ring, and it may be a monocyclic compound, condensed-ring compound or crosslinked compound. The cyclic structure may be a carbon ring or a heterocyclic ring. Carbon-carbon double bonds will hereunder also be denoted simply as C=C.

Condition ii) is that of having at least one and not more than four —OH structures in the molecule. The term "—OH structures" may include the —OH structures in substituent such as —COOH groups. That is, "—OH structures" includes not only the group —OH (hydroxyl group), but also —OH structures contained in substituent other than —OH groups, such as the —OH structure contained in a —COOH group (carboxyl group) or in a —CH=N—OH group. So long as the condition of having 1 to 4 —OH structures is satisfied, the structures may be present at any locations in the molecule. The number of —OH structures is preferably 1-2.

Condition iii) is that of having not more than one —COOH group (carboxyl group) in the molecule. That is, a compound having no carboxyl group or 1 carboxyl group in the molecule satisfies this condition.

Condition iv) is that the two adjacent carbon atoms have specific substituents. That is, an —OH group or —CH=N—OH group is bonded as a substituent to one of the carbon atoms. When an —OH group is bonded to one of the carbon atoms, a group —OX, =O, —NX, —NX($C^3$) or —CH=N—OH is bonded to the other carbon atom. Conversely, when a —CH=N—OH group is bonded to one of the carbon atoms, a group —OH or —CH=N—OH is bonded to the other carbon atom.

The aforementioned condition iv) may be restated as that of having a skeleton of either or both the first structure and/or second structure described below in the molecule.

First structure: A structure comprising a carbon atom $C^1$ and a carbon atom $C^2$ adjacent to the carbon atom $C^1$, wherein an —OH group is bonded to the carbon atom $C^1$, and at least one substituent selected from the group consisting of —OX, =O, —NX, —NX($C^3$) and —CH=N—OH groups is bonded to the carbon atom $C^2$ (where X represents hydrogen atom or a carbon atom and $C^3$ represents a carbon atom bonded to the nitrogen atom N in the —NX($C^3$) group. The bonding forms and bonding atoms of the remaining unshown bonds of the carbon atoms $C^1$, $C^2$ and $C^3$ are optional, and when X is a carbon atom, the bonding forms and bonding atoms of the remaining unshown bonds of X are optional. Also, the bonding forms and bonding atoms of the remaining unshown bonds of the nitrogen atom N in the —NX group are optional.)

Second structure: A structure comprising a carbon atom $C^1$ and a carbon atom $C^2$ adjacent to the carbon atom $C^1$, wherein a —CH═N—OH group is bonded to the carbon atom $C^1$ and a —CH═N—OH group is bonded to the carbon atom $C^2$ (where the bonding forms and bonding atoms of the remaining unshown bonds of the carbon atoms $C^1$ and $C^2$ are optional).

The optional bonding forms in the first structure and second structure may be single bonds or double bonds. Examples of optional bonding atoms include hydrogen, oxygen and nitrogen atoms. Bonding between the carbon atom $C^1$ and carbon atom $C^2$ in the first structure and second structure may be a single bond, double bond or triple bond, and the bond may also form a resonance structure. Bonding between the carbon atom $C^2$ and the nitrogen atom N of the —NX group in the first structure may be a single bond or double bond, and the bond may also form a resonance structure. More than one of the first structure and second structure may be present in the molecule.

Specifically, the first structure is preferably selected from among structures represented by the following formulas a) to m).

[Chemical Formula 4]

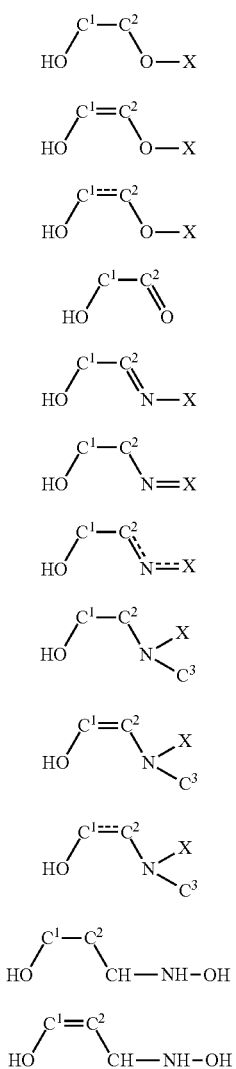

-continued

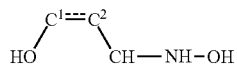

m)

[In the formulas, the bond represented by a pair of solid line and dotted line indicates a bond forming a resonance structure. The bonding forms and bonding atoms of the remaining unshown bonds of the carbon atoms $C^1$, $C^2$ and $C^3$ are optional, and when X is a carbon atom, the bonding forms and bonding atoms of the remaining unshown bonds of X are optional.]

Specifically, the second structure is preferably selected from among structures represented by the following formulas n) to p).

[Chemical Formula 5]

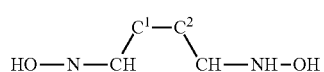

n)

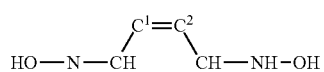

o)

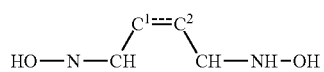

p)

[In the formulas, the bond represented by a pair of solid line and dotted line indicates a bond forming a resonance structure. The bonding forms and bonding atoms of the remaining unshown bonds of the carbon atoms $C^1$ and $C^2$ are optional.]

Condition v) is that either or both the carbon atom $C^1$ and/or carbon atom $C^2$ according to condition iv) forms part of the cyclic structure according to condition i), or is bonded to the cyclic structure according to condition i). This condition means that the carbon atom $C^1$ and the carbon atom $C^2$ to which specific substituents are bonded are in a specified positional relationship with the cyclic structure having at least one C═C bond. For example, when a complex compound comprising multiple rings has carbon atoms $C^1$ and $C^2$ satisfying condition iv) but the positional relationship with the cyclic structure according to condition i) does not satisfy condition v), a sufficiently high polishing speed cannot be achieved even when such a compound is used as additive B.

Specific examples of compounds as additive B satisfying the conditions specified above include 4-pyrone-based compounds such as 5-hydroxy-2-(hydroxymethyl)-4H-pyran-4-one, 3-hydroxy-2-methyl-4H-pyran-4-one and 3-hydroxy-2-ethyl-4H-pyran-4-one; and uracil-6-carboxylic acid, mandelic acid, salicylaldoxime, ascorbic acid, catechol, 3-methylcatechol, 4-methylcatechol, 4-tert-butylcatechol, 1,4-benzoquinonedioxime, 2-pyridinemethanol, 4-isopropyltropolone, 2-hydroxy-2,4,6-cycloheptatrien-1-one, 5-amino-uracil-6-carboxylic acid and benzilic acid. These may be used alone, or two or more may be used in combination.

The compounds used as additive A or additive B is preferably soluble in water. Using a compound with high solubility in water will allow the desired amount of additives to dissolve in the polishing solution, so that an even higher level of the effect of the invention can be obtained. The solubility of the compound is preferably 0.001 g, more preferably 0.005 g, even more preferably 0.01 g and especially preferably 0.05 g, with respect to 100 g of water at ordinary temperature (25° C.). There is no particular restriction for the upper limit of the solubility.

From the viewpoint of obtaining excellent water solubility, the preferred compounds for use as additive B are 5-hydroxy-2-(hydroxymethyl)-4H-pyran-4-one, ascorbic acid, salicylaldoxime, catechol, 2-pyridinemethanol and 2-hydroxy-2,4,6-cycloheptatrien-1-one. Even with a compound having a solubility of less than 0.001 g in 100 g of water, solubilization can be achieved by a method such as combining the water with an organic solvent. The organic solvent may be appropriately selected according to the type of compound used as additive A or additive B.

The compound used as additive A preferably allows satisfactory maintenance of dispersibility of the abrasive grains in the polishing solution. Satisfactory dispersion stability of the abrasive grains will allow a high polishing speed to be stably maintained for prolonged periods. From this viewpoint, 1,2-benzoisothiazole-3(2H)-one is preferred among the aforementioned compounds as additive A.

Likewise, the compounds used as additive B also preferably allow satisfactory maintenance of dispersibility of the abrasive grains in the polishing solution. From this viewpoint, the preferred compounds among those mentioned above for additive B include uracil-6-carboxylic acid, 5-hydroxy-2-(hydroxymethyl)-4H-pyran-4-one, 3-hydroxy-2-methyl-4H-pyran-4-one, salicylaldoxime, 1,4-benzoquinonedioxime, 2-pyridinemethanol, 4-isopropyltropolone, 2-hydroxy-2,4,6-cycloheptatrien-1-one and 5-amino-uracil-6-carboxylic acid.

"Satisfactory dispersion stability of the abrasive grains" means a long time in which the abrasive grains are dispersed in the polishing solution, after the abrasive grain content has been adjusted to prepare the polishing solution to a usable state. The time is preferably 1 hour or longer, more preferably 3 hours or longer, even more preferably 10 hours or longer and especially preferably 24 hours or longer. However, even when the abrasive grains have settled with the passage of time, redispersion treatment of the abrasive grains will allow CMP to be accomplished using the polishing solution. The dispersibility is evaluated by carrying out dispersion treatment of the polishing solution for 1 minute using an ultrasonic disperser, and measuring the mean particle size of the abrasive grains. The polishing solution is then allowed to stand at room temperature for a prescribed period of time, and the mean particle size of the abrasive grains is again measured. The dispersion stability may be judged to be satisfactory if the change in mean particle size before and after standing is not greater than ±5%. The method of measuring the mean particle size of the abrasive grains is described below.

Additive B is more preferably a 4-pyrone-based compound from among the compounds specified above, from the viewpoint of dispersion stability of the abrasive grains. The 4-pyrone-based compound has a structure with a hydroxy group bonded at least to the carbon atom adjacent to the carbon atom of the carbonyl group (C=O). A "4-pyrone-based compound" is a heterocyclic compound comprising an oxy group and a carbonyl group, with a six-membered ring (γ-pyrone ring) structure in which the carbonyl group is located at position 4 with respect to the oxy group. The 4-pyrone-based compound for this embodiment has a hydroxy group bonded to the carbon atom adjacent to the carbon atom of the carboxyl group of the γ-pyrone ring, and substituents other than hydrogen may substitute on the other carbon atoms of the γ-pyrone ring.

Such a 4-pyrone-based compound is a compound represented by the following formula (1).

[Chemical Formula 6]

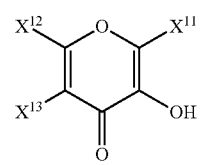

(1)

In the formula, $X^{11}$, $X^{12}$ and $X^{13}$ each independently represent hydrogen atom or a monovalent substituent. Monovalent substituents include aldehyde, hydroxyl, carboxyl, sulfonate, phosphate, bromine atom, chlorine atom, iodine atom, fluorine atom, nitro, hydrazine, alkyl groups with 1-8 carbon atoms ($C_1$-$C_8$ alkyl groups) (optionally substituted with OH, COOH, Br, Cl, I or $NO_2$), hydroxyalkyl, aryl groups with 6-12 carbon atoms ($C_6$-$C_{12}$ aryl groups) and alkenyl groups with 1-8 carbon atoms ($C_1$-$C_8$ alkenyl groups). When monovalent substituents are present among $X^{11}$, $X^{12}$ and $X^{13}$, the substituents are preferably bonded to the carbon atom adjacent to the oxy group, i.e. $X^{11}$ or $X^{12}$ is preferably a substituent. Preferably, at least two among $X^{11}$, $X^{12}$ and $X^{13}$ are hydrogen atom.

Preferred as 4-pyrone-based compounds are one or more compounds selected from the group consisting of 5-hydroxy-2-(hydroxymethyl)-4H-pyran-4-one (alternate name: 5-hydroxy-2-(hydroxymethyl)-4-pyrone), 3-hydroxy-2-methyl-4H-pyran-4-one (alternate name: 3-hydroxy-2-methyl-4-pyrone) and 3-hydroxy-2-ethyl-4H-pyran-4-one (alternate name: 3-hydroxy-2-ethyl-4-pyrone). Any one of these 4-pyrone-based compounds may be used alone, or two or more thereof may be used in combination. When the polishing solution comprises a combination of two or more 4-pyrone-based compounds, it will be possible to exhibit an effect of greater polishing speed for flat substrates and increased in-plane uniformity.

The 4-pyrone-based compound is preferably water-soluble. Using a compound with high solubility in water will allow the desired amount of additives to satisfactorily dissolve in the polishing solution, so that an even higher level of the effect of increasing the polishing speed and inhibiting aggregation of abrasive grains can be obtained. The solubility of the 4-pyrone-based compound is preferably at least 0.001 g, more preferably at least 0.005 g, even more preferably at least 0.01 g and especially preferably at least 0.05 g, in 100 g of water at ordinary temperature (25° C.). There is no particular restriction for the upper limit of the solubility.

[Additive C]

The polishing solution for CMP of this embodiment preferably comprises a saturated monocarboxylic acid as additive C. In this case, it is possible to further improve polishing speeds for silicon oxide films and to further improve in-plane uniformity of a substrate with a silicon oxide film on the surface.

Examples of the saturated monocarboxylic acid include acetic acid, propionic acid, butyric acid, isobutyric acid, valeric acid, isovaleric acid, pivalic acid, hydroangelic acid, caproic acid, 2-methylpentanoic acid, 4-methylpentanoic acid, 2,3-dimethylbutanoic acid, 2-ethylbutanoic acid, 2,2-dimethylbutanoic acid, 3,3-dimethylbutanoic acid, heptanoic acid, octanoic acid, nonanoic acid and decanoic acid. The number of carbon atoms of saturated monocarboxylic acid is preferably 2-6, more preferably 2-4. From the viewpoint of further improving polishing speeds for silicon oxide films and further improving in-plane uniformity of a substrate with a silicon oxide film on the surface, the saturated monocarboxylic acid with 2-6 carbon atoms is preferably at least one type of compound selected from the group consisting of acetic acid, propionic acid, butyric acid, isobutyric acid, valeric acid, isovaleric acid, pivalic acid, hydroangelic acid, caproic acid, 2-methylpentanoic acid, 4-methylpentanoic acid, 2,3-dimethylbutanoic acid, 2-ethylbutanoic acid, 2,2-dimethylbutanoic acid and 3,3-dimethylbutanoic acid. The saturated monocarboxylic acid may be used alone, or two or more may be used in combination.

(Abrasive Grains)

Examples of abrasive grains include particles comprising cerium-based compounds, alumina, silica, titania, zirconia, magnesia, mullite, silicon nitride, α-sialon, aluminum nitride, titanium nitride, silicon carbide, boron carbide or the like. Such particles may be used alone, or two or more may be used in combination. Among these, from the viewpoint of satisfactorily exhibiting the effect of the additives and obtaining a higher polishing speed for silicon oxide films, it is preferred to use particles comprising a cerium-based compound.

A polishing solution employing particles comprising a cerium-based compound as the abrasive grains has the feature of producing relatively little polishing damage on polished surfaces. Polishing solutions containing silica particles as abrasive grains have been widely used in the past to more easily achieve high polishing speeds for silicon oxide films. However, polishing solutions employing silica particles also generally tend to create polishing damage on polished surfaces. In devices having fine patterns with wiring widths on the order of 45 nm and smaller, even microscratches that have not conventionally been problematic can tend to affect the reliability of such devices.

Polishing solutions employing particles comprising cerium-based compounds have tended in the past to have somewhat slower polishing speeds for silicon oxide films, compared to those employing silica particles. According to this embodiment, however, a higher polishing speed for silicon oxide films is achieved by the combined use of the aforementioned additives with particles comprising a cerium-based compound. This suggests that the combination of a cerium-based compound with the aforementioned additives is particularly effective for polishing.

Examples of cerium-based compounds include cerium oxide, cerium hydroxide, cerium ammonium nitrate, cerium acetate, cerium sulfate hydrate, cerium bromate, cerium bromide, cerium chloride, cerium oxalate, cerium nitrate and cerium carbonate. Among these, cerium oxide particles are preferred for use as abrasive grains. Using cerium oxide particles will allow a higher polishing speed to be achieved while also obtaining a polished surface with low damage and excellent flatness.

The cerium oxide used as the abrasive grains preferably comprises polycrystalline cerium oxide with grain boundaries, and for example, it preferably comprises polycrystalline cerium oxide having multiple crystallites surrounded by grain boundaries. Polycrystalline cerium oxide particles having such a structure differ from simple aggregates of single crystal particles in that they are split by stress during polishing, while active surfaces (surfaces that are not exposed to the exterior before splitting) continually appear, thus presumably allowing a high polishing speed for silicon oxide films to be maintained. Such polycrystalline cerium oxide particles are described in detail in International Patent Publication No. WO99/31195.

The crystallites composing the polycrystalline cerium oxide preferably have a median crystallite size in the range of 1-100 nm, as observed under an electron microscope. The median crystallite size can be measured in the following manner. Specifically, for example, the cerium oxide particles in the polishing solution are observed with a SEM (Model S-4800 by Hitachi, Ltd., observation conditions: observation magnification: 100K, acceleration voltage: 1.0 kV), several (for example, 5) SEM photographs of the polycrystalline cerium oxide are obtained, and then several (for example, 11) of the primary particles of the cerium oxide surrounded by cerium oxide grain boundaries are randomly selected out from each particle photograph, and the primary particle sizes measured. The primary particle size is the square root of the product of the maximum diameter of the particles surrounded by the grain boundaries, and the bisector perpendicular thereto. The median value of the obtained measured values (for example, the value of the 28th particle as the median of 55 particles, in the example described above) is recorded as the median of the primary particle size.

There are no particular restrictions on the method for producing the cerium oxide particles, and examples include methods of liquid phase synthesis, firing or oxidation with hydrogen peroxide or the like. When such polycrystalline cerium oxide with grain boundaries is to be obtained, a method of firing a cerium source such as cerium carbonate is preferred. The temperature during the firing is preferably 350-900° C. When the produced cerium oxide particles have aggregated, they are preferably subjected to mechanical grinding. The grinding method is not particularly restricted, but for example, dry grinding process with a jet mill or a wet grinding process using a planetary bead mill is preferred. The jet mill used may be, for example, the one described in "Kagaku Kougaku Ronbunshu", Vol. 6, No. 5 (1980), p. 527-532. When polycrystalline cerium oxide having grain boundaries is to be added to the polishing solution for CMP, preferably the polycrystalline cerium oxide is produced by controlling the firing conditions, and the grinding conditions are controlled for grinding in a manner such that the polycrystalline cerium oxide is not all ground to the crystallite level (such that a part of the polycrystalline cerium oxide remains after grinding).

The mean particle size of the abrasive grains is preferably at least 50 nm, more preferably at least 70 nm and even more preferably at least 80 nm. If the mean particle size is at least 50 nm, it will be possible to further increase the polishing speed for silicon oxide films, compared to a mean particle size of less than 50 nm. On the other hand, the mean particle size of the abrasive grains is preferably not greater than 500 nm, more preferably not greater than 300 nm, even more preferably not greater than 280 nm, especially preferably not greater than 250 nm and yet more preferably not greater than 200 nm. If the mean particle size is not greater than 500 nm, it will be possible to better inhibit polishing damage than when it is greater than 500 nm. A publicly known method may be used to control the mean particle size of the abrasive grains, and for cerium oxide particles as an example, there may be used methods such as controlling the firing temperature, firing time and crushing conditions, or filtration, classification or the like.

The mean particle size of the abrasive grains is the median of the volume distribution measured for an abrasive grain-dispersed slurry sample using a dynamic light scattering particle size distribution meter. Specifically, it is the value measured using an LB-500 (trade name) by Horiba, Ltd. or a similar device. The sample concentration is adjusted to an abrasive grain content of 0.5 part by mass with respect to 100 parts by mass of the slurry sample, and after setting in the LB-500, the median of the volume distribution is measured.

By measuring the median diameter (cumulative median) using the LB-500, it is possible to evaluate the degree of abrasive grain aggregation. Measurement of the particle sizes of the abrasive grains in the polishing solution may be accomplished by the same method, after adjusting the polishing solution concentration to an abrasive grain content of 0.5 part by mass to 100 parts by mass of the polishing solution.

(Water)

The water used to prepare the polishing solution is not particularly restricted, but deionized water, ion-exchanged water or ultrapure water is preferred. If necessary, a polar solvent such as ethanol, acetic acid or acetone may be used together with the water.

(Other Components)

The polishing solution of this embodiment may contain a surfactant, from the viewpoint of improving the dispersion stability of the abrasive grains and/or the flatness of the polished surface. Examples of the surfactant include an ionic surfactant and nonionic surfactant, but preferably a nonionic surfactant is added. Examples of nonionic surfactants include ether-type surfactants such as polyoxypropylenepolyoxyethylene alkyl ethers, polyoxyethylene alkyl ethers, polyoxyethylenealkyl allyl ethers, polyoxyethylenepolyoxypropylene ether derivatives, polyoxypropylene glyceryl ether, polyethylene glycol, methoxypolyethylene glycol and oxyethylene adducts of acetylene-based diols, ester-type surfactants such as sorbitan fatty acid esters and glycerol borate fatty acid esters, aminoether-type surfactants such as polyoxyethylenealkylamines, ether ester-type surfactants such as polyoxyethylene sorbitan fatty acid esters, polyoxyethyleneglycerol borate fatty acid esters and polyoxyethylene alkyl esters, alkanolamide-type surfactants such as fatty acid alkanolamides and polyoxyethylene fatty acid alkanolamides, as well as oxyethylene adducts of acetylene-based diols, or polyvinylpyrrolidones, polyacrylamides, polydimethylacrylamides, polyvinyl alcohols or the like. These may be used alone, or two or more may be used in combination.

<Polishing Solution Preparation Method and Method of Use>

Polishing solutions may be categorized as (A) normal types, (B) concentrated types and (C) two-solution types, and the method of preparation and method of use will differ depending on the type. The (A) normal types are polishing solutions that can be used directly without pretreatment such as dilution at the time of polishing. The (B) concentrated types are polishing solutions in which the components are more concentrated than in (A) normal types, for convenience of storage and transport. The (C) two-solution types are polishing solutions that, during storage and transport, are kept as a solution A containing specific components and solution B containing other components, the solutions being mixed at the time of use.

The (A) normal types can be obtained by dissolving or dispersing the additives including the specific compounds mentioned above, abrasive grains, and other components as necessary, in water as the main dispersing medium. For example, in order to prepare 1000 g of a polishing solution comprising 0.5 part by mass of abrasive grains and 0.1 part by mass of additives with respect to 100 parts by mass of the polishing solution, the amounts of addition may be adjusted for 5 g of abrasive grains and 1 g of additives in the total polishing solution.

The polishing solution may be prepared using a stirrer, homogenizer, ultrasonic disperser or wet ball mill, for example. The abrasive grains may be subjected to micronization treatment during the polishing solution preparation process so that the mean particle size of the abrasive grains is within the desired range. Micronization treatment of the abrasive grains can be accomplished by precipitating classification or a method using a high-pressure homogenizer. Precipitating classification is a method comprising a step of forcibly precipitating the abrasive grain-containing slurry with a centrifugal separator, and a step of removing out only the supernatant liquid. A method using a high-pressure homogenizer involves impacting together the abrasive grains in the dispersing medium at high pressure.

The additive A content is preferably at least 0.01 part by mass, more preferably at least 0.02 part by mass and even more preferably at least 0.03 part by mass with respect to 100 parts by mass of the polishing solution. If the additive A content is at least 0.01 part by mass, it will be easier to achieve a stabilized polishing speed than when it is less than 0.01 part by mass. On the other hand, the additive A content is preferably not greater than 5.0 parts by mass, more preferably not greater than 3.0 parts by mass, even more preferably not greater than 1.0 part by mass and especially preferably not greater than 0.5 part by mass with respect to 100 parts by mass of the polishing solution. If the additive A content is not greater than 5.0 parts by mass, aggregation of the abrasive grains will be inhibited more easily and a higher polishing speed will be achieved, than when it is greater than 5.0 parts by mass.

When the polishing solution for CMP contains additive B, the total of the additive A content and the additive B content is preferably at least 0.01 part by mass, more preferably at least 0.02 part by mass and even more preferably at least 0.03 part by mass with respect to 100 parts by mass of the polishing solution. If the total amount of the additives is at least 0.01 part by mass, it will be easier to achieve a stabilized polishing speed than if it is less than 0.01 part by mass. On the other hand, the total amount of additives is preferably not greater than 5.0 parts by mass, more preferably not greater than 3.0 parts by mass, even more preferably not greater than 1.0 part by mass and especially preferably not greater than 0.5 part by mass with respect to 100 parts by mass of the polishing solution. If the total amount of the additives is not greater than 5.0 parts by mass, aggregation of the abrasive grains will be inhibited more easily and an even higher polishing speed will be achieved, than if it is greater than 5.0 parts by mass.

When the polishing solution for CMP contains additive C, the additive C content is preferably at least 0.01 part by mass, more preferably at least 0.05 part by mass and even more preferably at least 0.1 part by mass with respect to 100 parts by mass of the polishing solution. If the additive C content is at least 0.01 part by mass, it will be easier to obtain the effect of the saturated monocarboxylic acid. The additive C content is preferably not greater than 5.0 parts by mass, more preferably not greater than 3.0 parts by mass, even more preferably not greater than 2.0 parts by mass and especially preferably not greater than 1.0 part by mass with respect to 100 parts by mass of the polishing solution. If the additive C content is not greater than 5.0 parts by mass, aggregation of the abrasive grains will be inhibited more easily, a higher polishing speed and more satisfactory in-plane uniformity will be achieved, than when it is greater than 5.0 parts by mass.

The abrasive grain content (particle concentration) is preferably at least 0.01 part by mass, more preferably at least 0.025 part by mass, even more preferably at least 0.05 part by mass and especially preferably at least 0.1 part by mass, with respect to 100 parts by mass of the polishing solution. If the abrasive grain content is at least 0.01 part by mass, a higher polishing speed will be achieved than when it is less than 0.01 part by mass. On the other hand, the abrasive grain content is preferably not greater than 10 parts by mass, more preferably not greater than 5.0 parts by mass, even more preferably not greater than 3.0 parts by mass, especially preferably not greater than 2.0 parts by mass and yet more preferably not greater than 1.0 part by mass, with respect to 100 parts by mass of the polishing solution. If the abrasive grain content is not greater than 10 parts by mass, aggregation of the abrasive grains will be inhibited more easily and a higher polishing speed will be achieved, than when it is greater than 10 parts by mass.

When the polishing solution for CMP contains a surfactant, the surfactant content is preferably at least 0.0001 part by mass, more preferably at least 0.001 part by mass, even more preferably at least 0.005 part by mass with respect to 100 parts by mass of the polishing solution. The surfactant content is preferably not greater than 0.5 part by mass, more preferably not greater than 0.2 part by mass with respect to 100 parts by mass of the polishing solution.

The pH of the polishing solution is preferably not higher than 8.0, more preferably below 8.0, even more preferably not higher than 7.0, especially preferably not higher than 6.0 and yet more preferably not higher than 5.5. If the pH is not higher than 8.0, aggregation of the abrasive grains will be inhibited more easily and the effect of the additives will be obtained more easily, than when it is above 8.0. On the other hand, the pH of the polishing solution is preferably 1.5 or higher, more preferably 2.0 or higher and even more preferably 2.5 or higher. If the pH is 1.5 or higher, a larger absolute value for the zeta potential of the silicon oxide film will be obtainable, than when it is below 1.5.

It would appear that the following two effects are obtained by adjusting the pH of the polishing solution to the range of 1.5-8.0.

(1) The protons or hydroxy anions act on the compounds added as additives, altering the chemical forms of the compounds and improving the wettability or affinity of the substrate surface for the silicon oxide film or the silicon nitride stopper film.

(2) When the abrasive grains are made of cerium oxide, the contact efficiency between the abrasive grains and silicon oxide film is increased and a higher polishing speed is achieved. This is because cerium oxide has a positive sign for the zeta potential while the silicon oxide film has a negative sign for the zeta potential, such that electrostatic attraction works between them.

Since the pH of the polishing solution can change depending on the type of compounds used as additives, the polishing solution may include a pH regulator as an additive to adjust the pH to the range specified above. There are no particular restrictions on pH regulators, and examples include acids such as nitric acid, sulfuric acid, hydrochloric acid, phosphoric acid, boric acid and acetic acid, and bases such as sodium hydroxide, ammonia water, potassium hydroxide and calcium hydroxide. From the viewpoint of increasing productivity, the polishing solution may be prepared without using a pH regulator, and the polishing solution used directly for CMP.

The pH of the polishing solution can be measured using a pH meter (for example, a Model PHL-40 by DKK Corp.). The measured pH value that is used may be obtained by placing an electrode in the polishing solution after 2-point calibration using standard buffer (phthalate pH buffer: pH 4.01 (25° C.), neutral phosphate pH buffer: pH 6.86 (25° C.)), and measuring the value upon stabilization after an elapse of 2 minutes or more.

The (B) concentrated types are diluted with water immediately before use to the desired contents of the added components. After dilution, stirring may be carried out for any desired period of time until liquid properties (for example, pH or abrasive grain particle size) and polishing properties (for example, silicon oxide film polishing speed or selection ratio with stopper film (such as silicon nitride film)) equivalent to (A) normal types are again exhibited. With (B) concentrated types, the volume is reduced commensurately with the degree of concentration, and it is thus possible to lower storage and transport costs.

The concentration rate is preferably at least 1.5-fold, more preferably at least 2-fold, even more preferably at least 3-fold and especially preferably at least 5-fold. If the concentration rate is at least 1.5-fold, greater advantages for storage and transport can be obtained than when it is less than 1.5-fold. On the other hand, the concentration rate is preferably not greater than 40-fold, more preferably not greater than 20-fold and even more preferably not greater than 15-fold. If the concentration rate is not greater than 40-fold, it will be easier to inhibit aggregation of the abrasive grains than when it is greater than 40-fold.

The caution for use of (B) concentrated types is that the pH changes before and after dilution with water. In order to prepare a polishing solution having the same pH as a (A) normal type from a (B) concentrated type, the pH of the concentrated type polishing solution may be set lower beforehand, in consideration of pH increase by mixture with water. For example, when water dissolving carbon dioxide (pH: approximately 5.6) is used for 10-fold dilution of a (B) concentrated type polishing solution at pH 4.0, the diluted polishing solution will have a pH increased to about 4.3.

The pH of the (B) concentrated type is preferably 1.5-7.0 from the viewpoint of obtaining a polishing solution with an optimal pH after dilution with water. The lower limit for the pH is more preferably 2.0 and even more preferably 2.5. From the viewpoint of inhibiting aggregation of the abrasive grains, the upper limit for the pH is preferably 7.0, more preferably 6.5, even more preferably 6.0 and especially preferably 5.5.

The (C) two-solution type has the advantage of allowing aggregation of the abrasive grains to be avoided than a (B) concentrated type. Any components may be added to solution A and solution B. For example, a slurry comprising abrasive grains and a surfactant or the like added as necessary may be used as solution A, while a solution comprising additives and other components added as necessary may be used as solution B. In this case, the dispersibility of the abrasive grains in solution A may be increased by adding an optional acid or alkali to solution A for adjustment of the pH.

The (C) two-solution type polishing solution is useful when the polishing properties are reduced in a relatively short period of time by aggregation of the abrasive grains, in a state with each of the components mixed. From the viewpoint of reducing costs for storage and transport, either or both solution A and solution B may be concentrated types. In this case, solution A, solution B and water may be mixed when the polishing solution is to be used. The concentration rates and pH values for solution A or solution B may be as desired, so that the final mixture has liquid properties and polishing properties equivalent to those of a (A) normal type polishing solution.

<Polishing Method>

The polishing method of this embodiment employs a polishing solution with adjusted component contents and pH, for flattening of a substrate having a silicon oxide film on the surface using CMP technology. The polishing method is suitable for polishing of a substrate having a silicon oxide film on the surface, during production of the following devices. Such devices may be, for example, a discrete semiconductor such as a diode, transistor, compound semiconductor, thermistor, varistor or thyristor, a memory element such as DRAM (Dynamic Random Access Memory), SRAM (Static Random Access Memory), EPROM (Erasable Programmable Read-Only Memory), Mask ROM (Mask Read-Only Memory), EEPROM (Electrically Erasable Programmable Read-Only Memory) or Flash Memory, a logic circuit element such as a microprocessor, DSP or ASIC, an integrated circuit element such as a compound semiconductor, an example of which is an MMIC (Monolithic Microwave Integrated Circuit), a hybrid integrated circuit (hybrid IC), or a photoelectric conversion element such as a light emitting diode or charge-coupled element. Specifically, there is provided application of the polishing solution of this embodiment to polishing of a substrate having a silicon oxide film. There is also provided application of the polishing solution of this embodiment to polishing of a substrate having a silicon oxide film on the surface, during production of the devices mentioned above.

The polishing solution of this embodiment can achieve a high polishing speed without significant dependence on the condition of the surface to be polished. Thus, the polishing method using the polishing solution is suitable even for substrates with which it has been difficult to achieve a high polishing speed by methods employing conventional polishing solutions for CMP.

The polishing method of this embodiment is particularly suited for flattening of the surfaces to be polished with step height (convexo-concave) on the surface. Examples of substrates with such surfaces to be polished include logic semiconductor devices. Furthermore, the polishing method is suited for polishing of surfaces containing sections with concave portion or convex portion in a T-shaped or lattice-shaped fashion when viewed from above. For example, it can accomplish high-speed polishing of silicon oxide films formed on the surfaces of semiconductor devices with memory cells (for example, DRAM or Flash Memory). In other words, there is provided application of the polishing solution of this embodiment to polishing of surfaces containing sections with concave portion or convex portion in a T-shaped or lattice-shaped fashion when viewed from above.

The substrates that are suitable for the polishing method are not limited to those wherein the entire substrate surface is formed of a silicon oxide film, and they may also have a silicon nitride film, a polycrystalline silicon film or the like in addition to the silicon oxide film on the substrate surface. The polishing method may also be applied for substrates having an inorganic insulating film such as glass or silicon nitride, a polysilicon film, or a film composed mainly of Al, Cu, Ti, TiN, W, Ta, TaN or the like in addition to a silicon oxide film, on a wiring board with a prescribed wiring.

The method of forming the silicon oxide film on the substrate surface may be low-pressure CVD, plasma CVD or the like. Formation of a silicon oxide film by low-pressure CVD may employ monosilane ($SiH_4$) as the Si source and oxygen ($O_2$) as the oxygen source. The $SiH_4$—$O_2$ oxidation reaction is conducted at a low temperature of not higher than 400° C. to form a silicon oxide film. In some cases, heat treatment is carried out at 1000° C. or below after CVD.

Plasma CVD has the advantage of allowing a chemical reaction that requires high temperature at normal thermal equilibrium to take place at low temperature. Plasma generation methods include capacitive coupling and inductive coupling types. The reactive gas may be a $SiH_4$—$N_2O$ gas with $SiH_4$ as the Si source and $N_2O$ as the oxygen source, or a TEOS—$O_2$ gas with tetraethoxysilane (TEOS) as the Si source (TEOS-plasma CVD). The substrate temperature is preferably 250-400° C. and the reaction pressure is preferably 67-400 Pa.

When the silicon oxide film is doped with phosphorus (P) in order to achieve surface flattening with high-temperature reflow, a $SiH_4$—$O_2$—$PH_3$ reactive gas is preferably used. Thus, the silicon oxide film that is to be polished may be doped with an element such as phosphorus or boron.

The silicon nitride film, like the silicon oxide film, may also be formed by low-pressure CVD, plasma CVD or the like. In low-pressure CVD, dichlorsilane ($SiH_2Cl_2$) may be used as the Si source, and ammonia ($NH_3$) may be used as the nitrogen source. The $SiH_2Cl_2$—$NH_3$ oxidation reaction is conducted at a high temperature of 900° C. to form a silicon nitride film. In plasma CVD, the reactive gas may be a $SiH_4$—$NH_3$ gas with $SiH_4$ as the Si source and $NH_3$ as the nitrogen source. The substrate temperature in this case is preferably 300° C.-400° C.

A process for forming a shallow trench isolation (STI) structure by CMP by the polishing method of this embodiment will now be explained with reference to FIG. 1. The polishing method of this embodiment comprises a first step in which a silicon oxide film 3 is polished at high polishing speed (rough polishing step), and a second step in which the remaining silicon oxide film 3 is polished at a relatively low polishing speed (finishing step).

FIG. 1(a) is a cross-sectional view showing the substrate before polishing. FIG. 1(b) is a cross-sectional view showing the substrate after the first step. FIG. 1(c) is a cross-sectional view showing the substrate after the second step. As seen in these drawings, during the process of forming the STI structure, the partially protruding undesired sections are preferentially removed by CMP to eliminate step height D on the silicon oxide film 3 formed on the silicon substrate 1. In order to halt polishing at an appropriate point when the surface has been flattened, a silicon nitride film 2 with a slow polishing speed (stopper film) is preferably pre-formed under the silicon oxide film 3. The step height D on the silicon oxide film 3 is eliminated by the first and second steps, and a device isolation structure having an embedded section 5 is formed (see FIG. 1(c)).

For polishing of the silicon oxide film 3, a wafer is placed on the polishing pad, with the upper side of the silicon oxide film 3 contacting the polishing pad, and the surface of the silicon oxide film 3 is polished by the polishing pad. More specifically, the side of the surface to be polished of silicon oxide film 3 is pressed against the polishing pad of a polishing platen, and the silicon oxide film 3 is polished by relative movement between the surface to be polished and the polishing pad while supplying the polishing solution for CMP between the two. Thus, there is provided application of the polishing solution of this embodiment to polishing in a process for formation of a shallow trench isolation (STI) structure.

The polishing solution of this embodiment may be used in both the first and second steps, but from the standpoint of achieving a high polishing speed it is especially preferably used in the first step. The example described above assumes polishing in 2 stages, but polishing treatment may also be carried out in a single stage, from the state shown in FIG. 1(a) to the state shown in FIG. 1(c).

The polishing apparatus is preferably an apparatus comprising, for example, a holder which holds the substrate, a polishing platen on which the polishing pad is mounted, and means for supplying the polishing solution on the polishing pad. Examples of the polishing apparatus include polishing apparatuses by Ebara Corp. (Models EPO-111, EPO-222, FREX200 and FREX300), and polishing apparatuses by AMAT Corp. (trade name: Mirra3400, Reflection Polishing Machine). There are no particular restrictions on the polishing pad, and a common nonwoven fabric, foamed polyurethane, porous fluorine resin or the like may be used. The polishing pad is preferably furrowed to allow accumulation of the polishing solution.

There are no particular restrictions on the polishing conditions, but from the viewpoint of avoiding fly-off of the substrate, the rotational speed of the polishing platen is preferably not greater than 200 min$^{-1}$, and the pressure (working load) on the substrate is preferably not greater than 100 kPa from the viewpoint of inhibiting scarring of the polished surface. The polishing solution is preferably continuously supplied to the polishing pad with a pump during polishing. The amount supplied is not particularly restricted, but the surface of the polishing pad is preferably covered by the polishing solution at all times.

Upon completion of polishing, preferably the substrate is thoroughly rinsed in running water, and dried after removing the water droplets adhering to the substrate using a spin dryer or the like. Polishing in this manner allows convexo-concave on the surface to be eliminated, whereby a smooth surface across the entire substrate is obtained. By repeating the steps of film formation and polishing a prescribed number of times, it is possible to produce a substrate having a desired number of layers.

The substrate obtained in this manner may be used as an electronic component. Specific examples include semiconductor elements, optical glass such as photomask, lens and prisms, inorganic conductive films such as ITO, integrated optical circuits, optical switching elements and optical waveguides composed of glass and crystalline materials, end faces of optical fibers, optical single crystals such as scintillators, solid laser single crystals, blue laser LED sapphire substrates, semiconductor single crystals such as SiC, GaP and GaAs, magnetic disk glass panels, magnetic heads, and the like.

EXAMPLES

The present invention will now be explained in greater detail through the following examples, with the understanding that these examples are in no way limitative on the invention.

(Preparation of Abrasive Grains)

After placing 40 kg of cerium carbonate hydrate in an alumina container, it was fired at 830° C. for 2 hours in air to obtain 20 kg of yellowish white powder. The powder was subjected to phase identification by X-ray diffraction, and it was confirmed that the powder was cerium oxide powder. The particle size of the powder obtained by firing was 20-100 µm.

Next, 20 kg of cerium oxide powder was subjected to dry grinding using a jet mill until polycrystalline cerium oxide with grain boundaries remained. The ground cerium oxide powder had a specific surface area of 9.4 m$^2$/g. The specific surface area was measured by the BET method. When the ground cerium oxide powder was observed by SEM, and it was confirmed that the ground cerium oxide powder contained particles ground to the crystallite level and particles of polycrystalline cerium oxide with grain boundaries. 5 particles of the polycrystalline cerium oxide were randomly selected out from the SEM photograph and 11 randomly selected crystallite sizes were examined for each particle, the median crystallite size was found to be 70 nm.

(Preparation of Polishing Solution for CMP)

After mixing 15.0 kg of the previously obtained cerium oxide powder and 84.98 kg of deionized water, nitric acid was added to adjust the pH to below 4.5 and the mixture was stirred for 10 minutes. The obtained slurry was conveyed to a separate container through a tube, and the slurry in the tube was exposed to ultrasonic irradiation. The conveyance was over a period of 30 minutes with an ultrasonic frequency of 400 kHz.

A 500 g±20 g portion of slurry was dispensed into each of four 500 mL beakers, and centrifugal separation was performed. The centrifugal separation was performed for 2 minutes under conditions with an outer peripheral centrifugal force of 500 G. The cerium oxide precipitating on the bottom of the beaker was collected. In this way, the slurry with abrasive grain concentration of 10.0 mass % was obtained.

After adjusting the slurry concentration to an abrasive grain content of 0.5 mass % based on the total mass of the slurry by diluting the previously obtained slurry with deionized water, the mean particle size of the abrasive grains was measured using a dynamic light scattering particle size distribution meter [trade name: LB-500 by Horiba, Ltd.], and the mean particle size was found to be 150 nm.

Examples 1-13, Comparative Examples 14-15

Polishing solutions for Examples 1-13 were prepared using additive A, and in some cases additive B which satisfied conditions i) to v) or additive C which was a saturated monocarboxylic acid (see Table 1). Separately, polishing solutions for Comparative Examples 14-15 were prepared using as the additive a thiazole compound that did not qualify as additive A (see Table 2).

After mixing the slurry described above (abrasive grain concentration: 10.0 mass %) and the additives listed in Tables 1 and 2, moderate amount of deionized water was added so that the content of each component was adjusted to the content listed in Tables 1 and 2, the mixture was then stirred over a period of 10 minutes. Next, the pH of the polishing solution was adjusted to the prescribed value by adding ammonia water (NH$_4$OH) as a pH regulator to obtain 10-fold concentrated solution of polishing solution for CMP (see Tables 1 and 2. Abrasive grain concentration is 5.0 mass %). The pH of each concentrated solution was measured using a Model PHL-40 by DKK Corp.

(Polishing of Silicon Oxide Film)

Each of the 10-fold concentrated solution of polishing solution for CMP prepared in the manner described above was diluted 10-fold with deionized water to obtain polishing solution for CMP (Abrasive grain concentration is 0.5 mass %, each content of the additives is one tenth of value described in Tables 1 and 2). Each pH of the polishing solution for CMP is shown in Tables 1 and 2. Each pH of the polishing solution for CMP was measured using a Model PHL-40 by DKK Corp. Each mean particle size of the abrasive grains in the polishing solution was found to be 150±10 nm.

The polishing solution for CMP was used for polishing of a DRAM device wafer having a silicon oxide film on the surface. The DRAM device wafer has a silicon oxide film with fine convexo-concave, and it has an initial step height of about 600 nm between convex portion and concave portion. The wiring is formed in a lattice shape with parallel lines, and the silicon oxide film has a concavo-convex shape corresponding to the wiring shape.

A polishing apparatus (trade name: Mirra3400 by Applied Materials, Inc.) was used for CMP of a DRAM device wafer. The DRAM device wafer was set in a holder equipped with a substrate-mounting adsorption pad. Also, a porous urethane resin polishing pad (k-groove, Model IC-1400 by Rodel) was mounted on a 500 mm-diameter polishing platen.

The holder was placed on the polishing pad with the silicon oxide film-formed side of the DRAM device wafer facing downward. The inner tube pressure, retainer ring pressure and membrane pressure were set to 28 kPa, 38 kPa and 28 kPa, respectively.

While dropping each polishing solution prepared as described above onto the platen at a flow rate of 200 mL/min, the platen and the DRAM device wafer were rotated at 93 $min^{-1}$ and 87 $min^{-1}$, respectively, for polishing of the silicon oxide film. The polished wafer was thoroughly cleaned with purified water using a PVA brush (polyvinyl alcohol brush), and then dried.

(Polishing Speed Evaluation)

A light-interference film thickness device (trade name: RE-3000 by Dainippon Screen Mfg. Co., Ltd.) was used to measure the change in film thickness of the silicon oxide film before and after polishing, and the polishing speed was calculated from the average change in film thickness. The results are shown in Tables 1 and 2.

Except that a φ200 mm blanket wafer having a silicon oxide film with an initial film thickness of approximately 1000 nm (product of Advantech, Inc.) was used instead of a DRAM device wafer, and the measuring was conducted at a total of 41 points consisting of the center point of the wafer and the points at 5 mm intervals from the center point in the diameter direction (the next measuring point from the measuring point 95 mm from the center was at a location 97 mm from the center), the change in film thickness was determined at the 41 points by the same method as in "Polishing speed evaluation". The value of the standard deviation of the change in film thickness divided by the average value of the change in film thickness and multiplied by 100 was determined and used as the in-plane uniformity. The results are shown in Tables 1 and 2.

TABLE 1

| | 10-fold concentrated solution of polishing solution for CMP | | | | polishing solution for CMP | | |
|---|---|---|---|---|---|---|---|
| No. | Additive A (content [mass %]) | Additive B (content [mass %]) | Additive C (content [mass %]) | pH | Pattern polishing speed [Å/min] | In-plane uniformity [%] | pH |
| 1 | 1,2-Benzoisothiazol-3(2H)-one (1.0) | — | — | 4.8 | 1600 | 12.1 | 5.1 |
| 2 | 1,2-Benzoisothiazol-3(2H)-one (1.0) | — | propionic acid (1.0) | 4.8 | 1700 | 5.6 | 5.1 |
| 3 | 2-Aminothiazole (1.0) | — | — | 5.0 | 1500 | 11.1 | 5.3 |
| 4 | 2-Aminothiazole (1.0) | — | propionic acid (1.0) | 5.0 | 1750 | 6.7 | 5.3 |
| 5 | 1,2-Benzoisothiazol-3(2H)-one (0.5) | 5-Hydroxy-2-(hydroxymethyl)-4H-pyran-4-one (0.5) | — | 4.9 | 1800 | 6.8 | 5.2 |
| 6 | 1,2-Benzoisothiazol-3(2H)-one (0.5) | 3-Hydroxy-2-methyl-4H-pyran-4-one (0.5) | — | 4.9 | 1800 | 8.7 | 5.2 |
| 7 | 1,2-Benzoisothiazol-3(2H)-one (0.5) | 4-Isopropyltropolone (0.5) | — | 4.7 | 1700 | 9.1 | 5.0 |
| 8 | 1,2-Benzoisothiazol-3(2H)-one (0.5) | Uracil-6-carboxylic acid (0.5) | — | 2.6 | 1400 | 5.6 | 2.9 |
| 9 | 1,2-Benzoisothiazol-3(2H)-one (0.5) | 4-Methylcatechol (0.5) | — | 6.0 | 1600 | 8.9 | 6.3 |
| 10 | 1,2-Benzoisothiazol-3(2H)-one (0.5) | 2-Pyridinemethanol (0.5) | — | 3.5 | 1500 | 10.2 | 3.8 |
| 11 | 1,2-Benzoisothiazol-3(2H)-one (0.5) | Salicylaldoxime (0.5) | — | 5.0 | 1300 | 8.7 | 5.3 |
| 12 | 1,2-Benzoisothiazol-3(2H)-one (0.5) | 2-Hydroxy-2,4,6-cycloheptatrien-1-one (0.5) | — | 4.9 | 1700 | 10.3 | 5.2 |
| 13 | 1,2-Benzoisothiazol-3(2H)-one (0.5) | 1,4-Benzoquinonedioxime (0.5) | — | 4.8 | 1500 | 11.1 | 5.1 |

TABLE 2

| | 10-fold concentrated solution of polishing solution for CMP | | polishing solution for CMP | | |
|---|---|---|---|---|---|
| No. | Additive (content [mass %]) | pH | Pattern polishing speed [Å/min] | In-plane uniformity [%] | pH |
| 14 | 2-Aminobenzothiazole (1.0) | 4.8 | 100 | 12.3 | 5.1 |
| 15 | 2-Amino-5-mercapto-dithiazole (1.0) | 5.0 | 100 | 13.4 | 5.3 |

The results shown in Tables 1 and 2 indicated that the polishing solutions of Examples 1-13 that used specific compounds as additive A allowed polishing of silicon oxide films at a higher speed than the polishing solutions of Comparative Examples 14-15.

Also, the polishing solutions of Examples 5, 6 and 7 were each used for polishing of a silicon oxide film blanket wafer instead of a DRAM device wafer. The relative values for the polishing speeds of Examples 6 and 7 were 3 or higher, with respect to 1 as the polishing speed in Example 5. Polishing of the blanket wafer and evaluation of polishing speed were conducted in the same manner as for the DRAM device wafer, except that a different wafer was used.

Example 16

Polishing solution for CMP of Example 16 was prepared to confirm effect of surfactant (see Table 3). The surfactant content was adjusted to 0.01 mass % based on the total mass of the polishing solution for CMP. As compared to Example 1, it is clearly indicated that in-plane uniformity is improved by using the polishing solution for CMP comprising a nonionic surfactant in Example 16.

TABLE 3

| | 10-fold concentrated solution of polishing solution for CMP | | | polishing solution for CMP Pattern | | |
|---|---|---|---|---|---|---|
| No. | Additive A (content [mass %]) | Surfactant (content [mass %]) | pH | polishing speed [Å/min] | In-plane uniformity [%] | pH |
| 16 | 1,2-Benzoisothiazol-3(2H)-one (1.0) | PEG4000 (0.1) | 4.8 | 1500 | 4.2 | 5.1 |

In the present specification, the present inventors have described preferred modes for carrying out the invention. Similar preferred modifications will also be readily apparent to a person skilled in the art from the description related herein. The present inventors are also well aware of different modes of the invention or inventions of similar form that apply the core principle of the invention. In addition, the invention includes, in principle, all modified forms of the content described in the Claims, and any desired combination of such elements may be employed. All possible combinations thereof are encompassed by the invention, unless otherwise specified in the present specification or unless specifically negated by context.

According to the invention there is provided a polishing solution for CMP with high flexibility of use, that can achieve a sufficiently high polishing speed for silicon oxide films while being less dependent on the substrate surface condition compared to conventional polishing solutions. According to the invention there is also provided a polishing method using the polishing solution.

What is claimed is:

1. A polishing solution for CMP comprising abrasive grains, a first additive a second additive and water, wherein the first additive is at least 1,2-benzoisothiazole-3(2H)-one or 2-aminothiazole; and the second additive satisfying the following conditions i) to v):

i) having in a molecule at least cyclic structure including at least one carbon-carbon double bond, the "carbon-carbon double bond" optionally including carbon-carbon bonds forming a resonance structure;

ii) having at least one and not more than four —OH structures in a molecule, the —OH structures optionally including —OH structures in —COOH groups;

iii) having not more than one —COOH group in a molecule;

iv) having either or both the following first structure and/or second structure in a molecule;

first structure: a structure comprising a carbon atom $C^1$ and a carbon atom $C^2$ adjacent to the carbon atom $C^1$, an —OH group being bonded to the carbon atom $C^1$, and at least one substituent selected from the group consisting of —OX, =O, —NX, —NX($C^3$) and —CH=N—OH groups being bonded to the carbon atom $C^2$, where X represents hydrogen atom or a carbon atom and $C^3$ represents a carbon atom bonded to the nitrogen atom N in the —NX($C^3$) group, wherein bonding forms and bonding atoms of remaining unshown bonds of the carbon atoms $C^1$, $C^2$ and $C^3$ are optional, and when X is a carbon atom, bonding forms and bonding atoms of remaining unshown bonds of X are optional;

second structure: a structure comprising a carbon atom $C^1$ and a carbon atom $C^2$ adjacent to the carbon atom $C^1$, a —CH=N—OH group being bonded to the carbon atom $C^1$ and a —CH=N—OH group being bonded to the carbon atom $C^2$, wherein bonding forms and bonding atoms of remaining unshown bonds of the carbon atoms $C^1$ and $C^2$ are optional;

v) either or both the carbon atom $C^1$ and/or carbon atom $C^2$ according to condition iv) forms part of the cyclic structure according to condition i), or is bonded to the cyclic structure according to condition i);

wherein the first structure according to condition iv) is selected from among structures represented by the following formulas a), b), d)-l):

[Chemical Formula 1]

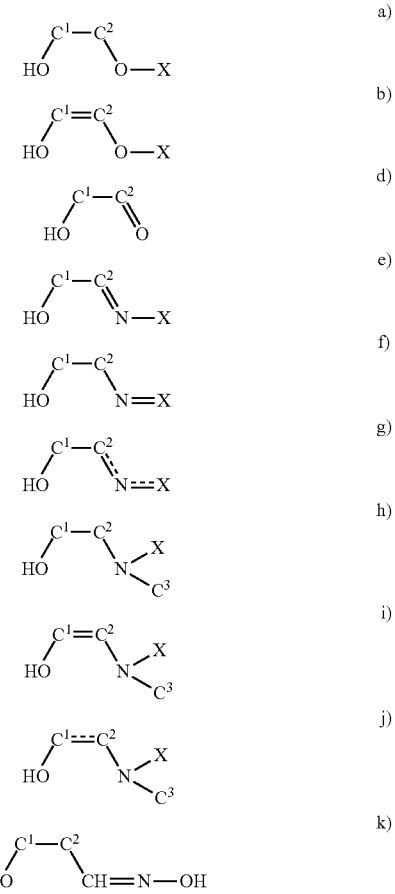

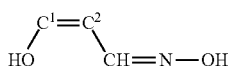
l)

in the formulas a), b), d)-l), the bond represented by a pair of solid line and dotted line indicates a bond forming a resonance structure, bonding forms and bonding atoms of remaining unshown bonds of the carbon atoms $C^1$, $C^2$ and $C^3$ are optional, and when X is a carbon atom, bonding forms and bonding atoms of remaining unshown bonds of X are optional.

2. The polishing solution for CMP according to claim 1, wherein the second structure according to condition iv) is selected from among structures represented by the following formulas n) to p):

[Chemical Formula 2]

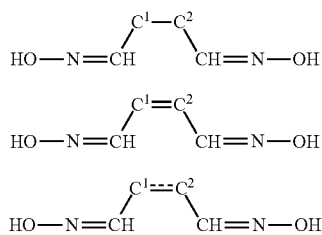

in the formulas 2 n) to p), the bond represented by a pair of solid line and dotted line indicates a bond forming a resonance structure, and bonding forms and bonding atoms of remaining unshown bonds of the carbon atoms $C^1$ and $C^2$ are optional.

3. The polishing solution for CMP according to claim 1, wherein the second additive is at least one type of compound selected from the group consisting of uracil-6-carboxylic acid, mandelic acid, ascorbic acid, 1,4-benzoquinonedioxime, 2-pyridinemethanol, 4-isopropyltropolone, 2-hydroxy-2,4,6-cycloheptatrien-1-one, 5-amino-uracil-6-carboxylic acid and benzilic acid.

4. The polishing solution for CMP according to claim 1, wherein the second additive is a 4-pyrone-based compound represented by the following formula (1):

[Chemical Formula 3]

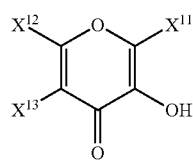
(1)

in the formula 3, $X^{11}$, $X^{12}$ and $X^{13}$ each independently represent hydrogen atom or a monovalent substituent.

5. The polishing solution for CMP according to claim 4, wherein the 4-pyrone-based compound is at least one type of compound selected from the group consisting of 5-hydroxy-2-(hydroxymethyl)-4H-pyran-4-one, 3-hydroxy-2-methyl-4H-pyran-4-one and 3-hydroxy-2-ethyl-4H-pyran-4-one.

6. The polishing solution for CMP according to claim 1, wherein a total of a first additive content and a second additive content is 0.01-5.0 parts by mass with respect to 100 parts by mass of the polishing solution for CMP.

7. The polishing solution for CMP according to claim 1, further comprising a saturated monocarboxylic acid.

8. The polishing solution for CMP according to claim 7, wherein the number of carbon atoms of the saturated monocarboxylic acid is 2-6.

9. The polishing solution for CMP according to claim 7, wherein the saturated monocarboxylic acid is at least one type of compound selected from the group consisting of acetic acid, propionic acid, butyric acid, isobutyric acid, valeric acid, isovaleric acid, pivalic acid, hydroangelic acid, caproic acid, 2-methylpentanoic acid, 4-methylpentanoic acid, 2,3-dimethylbutanoic acid, 2-ethylbutanoic acid, 2,2-dimethylbutanoic acid and 3,3-dimethylbutanoic acid.

10. The polishing solution for CMP according claim 1, wherein a pH is not higher than 8.0.

11. The polishing solution for CMP according to claim 1, further comprising a pH regulator.

12. The polishing solution for CMP according to claim 1, wherein a first additive content is 0.01-5.0 parts by mass with respect to 100 parts by mass of the polishing solution for CMP.

13. The polishing solution for CMP according to claim 1, wherein an abrasive grain content is 0.01-10 parts by mass with respect to 100 parts by mass of the polishing solution for CMP.

14. The polishing solution for CMP according to claim 1, wherein a mean particle size of the abrasive grains is 50-500 nm.

15. The polishing solution for CMP according to claim 1, wherein the abrasive grains comprise a cerium-based compound.

16. The polishing solution for CMP according to claim 15, wherein the cerium-based compound is cerium oxide.

17. The polishing solution for CMP according to claim 1, wherein the abrasive grains comprise polycrystalline cerium oxide with grain boundaries.

18. The polishing solution for CMP according to claim 1, further comprising a nonionic surfactant.

19. A polishing method for a substrate having a silicon oxide film on a surface, the polishing method comprising
a step of polishing the silicon oxide film with a polishing pad while supplying the polishing solution for CMP according to claim 1 between the silicon oxide film and the polishing pad.

\* \* \* \* \*